(12) United States Patent
Nagatani et al.

(10) Patent No.: US 11,888,495 B2
(45) Date of Patent: Jan. 30, 2024

(54) ANALOG MULTIPLEXER CIRCUIT AND ANALOG-DIGITAL CONVERSION SYSTEM

(71) Applicant: Nippon Telegraph and Telephone Corporation, Tokyo (JP)

(72) Inventors: Munehiko Nagatani, Tokyo (JP); Teruo Jo, Tokyo (JP); Hiroshi Yamazaki, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 145 days.

(21) Appl. No.: 17/768,168

(22) PCT Filed: Oct. 23, 2019

(86) PCT No.: PCT/JP2019/041475
§ 371 (c)(1),
(2) Date: Apr. 11, 2022

(87) PCT Pub. No.: WO2021/079426
PCT Pub. Date: Apr. 29, 2021

(65) Prior Publication Data
US 2023/0336185 A1   Oct. 19, 2023

(51) Int. Cl.
*H03M 1/12* (2006.01)
*H03K 17/693* (2006.01)

(52) U.S. Cl.
CPC ........ *H03M 1/1255* (2013.01); *H03K 17/693* (2013.01); *H03M 1/1295* (2013.01)

(58) Field of Classification Search
CPC . H03M 1/1255; H03M 1/1295; H03K 17/693
See application file for complete search history.

(56) References Cited

U.S. PATENT DOCUMENTS

| | | | | |
|---|---|---|---|---|
| 6,169,505 B1 * | 1/2001 | Nishimura | ............ | H03M 1/662 341/141 |
| 2005/0242836 A1 * | 11/2005 | Goetting | ............ | G01R 31/3167 326/39 |

OTHER PUBLICATIONS

Jun Cao et al., "A Transmitter and Receiver for 100Gb/s Coherent Networks with Integrated 4×64GS/s 8b ADCs and DACs in 20nm CMOS," Feb. 8, 2017, IEEE International Solid-State Circuits Conference, pp. 484-486.

Laperle et al., "Advances in High-Speed DACs, ADCs, and DSP for Optical Coherent Transceivers," Journal of Lightwave Technology, vol. 32, No. 4, Feb. 15, 2014, pp. 629-643.

* cited by examiner

*Primary Examiner* — Jean B Jeanglaude
(74) *Attorney, Agent, or Firm* — Slater Matsil, LLP

(57) ABSTRACT

An analog demultiplexer circuit includes a clock distribution circuit that outputs clock signals (CK1P and CK1N) and clock signals (CK2P and CK2N) complementary thereto, a track-and-hold circuit that holds analog input signals (VINP and VINN) in synchronization with the clock signals (CK1P and CK1N), and a track-and-hold circuit that holds the analog input signals (VINP and VINN) in synchronization with the clock signals (CK2P and CK2N).

9 Claims, 24 Drawing Sheets

ANALOG MULTIPLEXER CIRCUIT AND ANALOG-DIGITAL CONVERSION SYSTEM

CROSS-REFERENCE TO RELATED APPLICATIONS

This application is a national phase entry of PCT Application No. PCT/JP2019/041475, filed on Oct. 23, 2019, which application is hereby incorporated herein by reference.

TECHNICAL FIELD

The present invention relates to an analog demultiplexer circuit having a function of complementarily tracking and holding wideband analog signals by clock signals and distributing into two and outputting the analog signals, and a wideband analog-to-digital conversion system using the analog demultiplexer circuit.

BACKGROUND

The need for high-speed and wideband analog-to-digital converters (hereinafter referred to as ADCs) is increasing in measuring instruments and wired/wireless communication applications. A sampling rate (an index indicating how many times an analog signal can be sampled and converted into a digital signal per second) is well known as a speed performance index of an ADC.

In recent years, an architecture called time interleaving has been widely used as a means for increasing the sampling rate. Time interleaving is a technique that enables conversion at a high sampling rate as a whole by arranging relatively low-speed ADCs in parallel and sampling by shifting the phase of a clock signal input to each ADC (see NPL 1).

FIG. 16 is a block diagram showing the configuration of a time-interleaved ADCs, and FIG. 17 is a waveform diagram illustrating the operation of the time-interleaved ADC. In the example of FIG. 16, the time-interleaved ADC is composed of three ADCs 201, 202, and 203. Clock signals CK1, CK2, and CK3 are input to the ADCs 201, 202, and 203, respectively, and an analog input signal VIN to be converted is input to each of the ADCs 201, 202, and 203. The ADCs 201, 202, and 203 sample the analog input signal VIN at the rising timing of the clock signals CK1, CK2, and CK3, respectively, and convert the input signal into digital signals VOUT. As a result, the effective sampling clock becomes as shown in CK4 in FIG. 17.

However, problems are associated with the time-interleaved ADCs as well. In the time-interleaved configuration, a plurality of ADCs 201 to 203 is connected in parallel to an input node 204. Therefore, input parasitic capacitances equal in number to the parallel connections of the ADCs are connected to the input node 204. As a result, these parasitic capacitances form a low-pass filter, so that high-frequency components are attenuated.

In NPL 1, an ultra-high sampling rate of 64 GS/s is realized by adopting a time-interleaved ADC, but the analog input band is limited to about 20 GHz. According to a sampling theorem, it is possible to realize an ADC capable of sampling an analog signal up to 32 GHz, which is a Nyquist frequency of 64 GS/s. However, due to the low-pass filter effect of the input node section described above, in reality, analog signals up to the Nyquist frequency cannot be handled.

The Nyquist frequency is fs/2 with respect to the sampling frequency fs, and the band required for ideal sampling is shown by reference numeral 70 in FIG. 18. However, the analog input band of the time-interleaved ADC is limited to B, which is lower than the Nyquist frequency fs/2, as shown by reference numeral 71 of FIG. 18.

Thus, it can be said that the time-interleaved ADC is effective in improving the sampling rate, but the expansion of the analog input band is difficult.

Meanwhile, an analog-to-digital conversion system using a mixer or the like has also been proposed as a means for realizing a wide-band ADC (see NPL 2). FIG. 19 is a block diagram showing a configuration of an analog-to-digital conversion system disclosed in NPL 2. The analog-to-digital conversion system includes a high-pass filter 300, a mixer 301, ADCs 302 and 303, and a DSP (Digital Signal Processor) 304.

In the analog-to-digital conversion system of FIG. 19, a wideband analog input signal VIN is branched into two, and one of them is input as it is to the ADC 302. The high-pass filter 300 extracts only a high-frequency component from the analog input signal VIN. The mixer 301 converts the high-frequency component to a low frequency by mixing the output signal of the high-pass filter 300 and a clock signal CK. The ADCs 302 and 303 convert the analog input signal VIN and the output signal of the mixer 301 into digital signals, respectively. Then, the DSP 304 demodulates a signal in the same band as the analog input signal VIN from the output signals of the ADCs 302 and 303.

FIG. 20A shows the band of the analog input signal VIN, FIG. 20B shows the band of the output signal of the high-pass filter 300, FIG. 20C shows the band of the output signal of the mixer 301, FIG. 20D shows the output signal of the ADC 302, FIG. 20E shows the band of the output signal of an ADC 303, and FIG. 20F shows the band of the output signal VOUT of the DSP 304.

fs is the sampling frequency, which is the frequency of the clock signal CK input to the mixer 301 and the ADCs 302 and 303. Further, in FIGS. 20A to 20F, reference numeral 80 indicates a low-frequency component of the analog input signal VIN, and reference numeral 81 indicates a high-frequency component of the analog input signal VIN. Reference numeral 82 denotes a component in which the high-frequency component of the analog input signal VIN is converted to a low frequency by the mixer 301, and reference numeral 83 indicates a component demodulated by the DSP 304.

Where the analog-to-digital conversion system disclosed in NPL 2 is used, the two ADCs 302 and 303 need only have half the input band (fs/2) of the analog input signal VIN. The system as a whole works as an ADC with an input band (fs) twice that of the individual ADCs 302 and 303.

However, the analog-to-digital conversion system disclosed in NPL 2 has a problem that a high-pass filter 300 having a very steep characteristic and a large size is required. Further, in this analog-to-digital conversion system, the paths of the two branched signals are asymmetric. The resulting problem is that a large difference occurs in the loss and delay time of the two signals due to the difference in the number of components through which the signals pass and the like, and the imbalance compensation of the output signals of the ADCs 302 and 303 at the time of signal demodulation in the DSP 304 becomes complicated.

CITATION LIST

Non Patent Literature

NPL 1 J. Cao et al., "A transmitter and receiver for 100 Gb/s coherent networks with integrated 4×64 GS/s 8b ADCs and DACs in 20 nm CMOS", Proc. ISSCC 2017, 29.2.

NPL 2 C. Laperle et al., "Advances in High-Speed DACs, ADCs, and DSP for Optical Coherent Transceivers", JOURNAL OF LIGHTWAVE TECHNOLOGY, vol. 32, no. 4, pp. 629-643, 2014.

SUMMARY

Technical Problem

Embodiments of the present invention have been created to solve the above problems, and an object of embodiments of the present invention is to provide an analog demultiplexer circuit and an analog-to-digital conversion system capable of easily expanding an analog input band.

Means for Solving the Problem

The analog demultiplexer circuit of embodiments of the present invention includes: a clock distribution circuit configured to output first clock signals and second clock signals complementary thereto; a first track-and-hold circuit configured to hold analog input signals in synchronization with the first clock signals; and a second track-and-hold circuit configured to hold the analog input signals in synchronization with the second clock signals.

Further, the analog-to-digital conversion system of embodiments of the present invention includes: the analog demultiplexer circuit; a first analog-to-digital converter configured to convert an analog output signal output from the first track-and-hold circuit of the analog demultiplexer circuit into a digital signal; a second analog-to-digital converter configured to convert an analog output signal output from the second track-and-hold circuit of the analog demultiplexer circuit into a digital signal; a first addition unit configured to add an output signal of the first analog-to-digital converter and an output signal of the second analog-to-digital converter; a subtraction unit configured to subtract the output signal of the second analog-to-digital converter from the output signal of the first analog-to-digital converter; a folding processing unit configured to execute a folding processing of the output signals of the subtraction unit with the frequency of ½ of the first and second clock signals as a boundary; and a second addition unit configured to add an output signal of the first addition unit and an output signal of the folding processing unit.

Effects of Embodiments of the Invention

By using the analog demultiplexer circuit of embodiments of the present invention in an input circuit, it is possible to double the conventional analog input band of the analog-to-digital conversion system. Further, embodiments of the present invention do not require a large-sized filter such as in the conventional analog-to-digital conversion system. Furthermore, in embodiments of the present invention, since a large intensity difference or phase difference does not occur in the signals passing through the first and second track-and-hold circuits, the compensation process at the time of demodulation can also be simplified as compared with that of the conventional analog-to-digital conversion system.

DETAILED DESCRIPTION OF ILLUSTRATIVE EMBODIMENTS

First Embodiment

Figure 1:
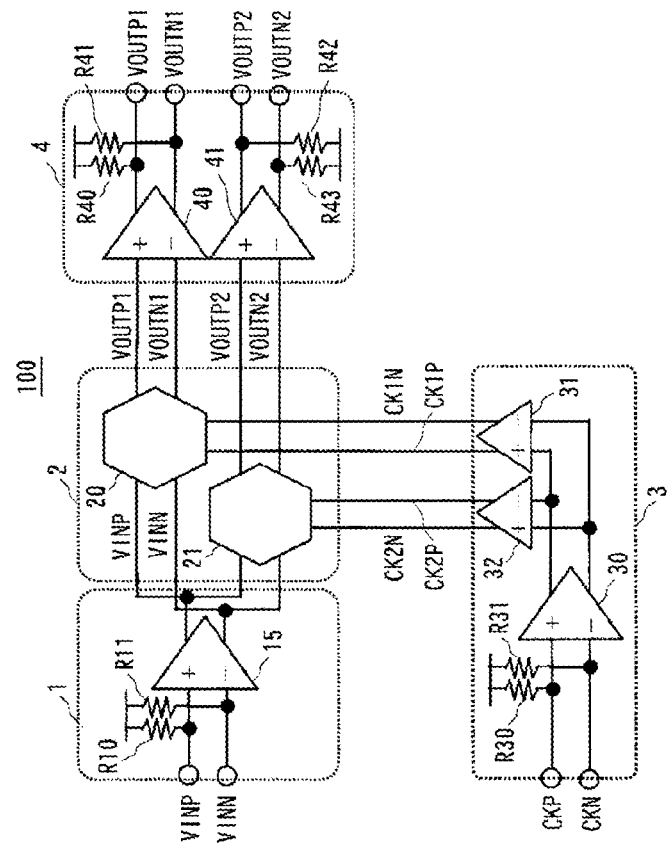
FIG. 1 is a block diagram showing a configuration of an analog demultiplexer circuit according to a first embodiment of the present invention.

Hereinafter, embodiments of the present invention will be described with reference to the drawings. FIG. 1 is a block diagram showing a configuration of an analog demultiplexer circuit according to a first embodiment of the present invention.

An analog demultiplexer circuit 100 of the present embodiment includes an input distribution circuit 1 that linearly distributes differential analog input signals VINP and VINN into two, a track-and-hold circuit (hereinafter, T/H circuit) 2 that samples and holds each analog signal distributed into two by the input distribution circuit 1, a clock distribution circuit 3 that generates differential clock signals CK1P and CK1N and differential clock signals CK2P and CK2N complementary thereto from differential clock signals CKP and CKN for driving the T/H circuit 2, and an output buffer 4 that outputs differential analog output signals VOUTP1 and VOUTN1 and differential analog output signals VOUTP2 and VOUTN2 received from the T/H circuit 2.

The input distribution circuit 1 is configured of a 50Ω receiving end resistor R10 for impedance matching that is connected at one end to a power supply voltage and connected at the other end to a positive phase input terminal to which the analog input signal VINP is input, a 50Ω receiving end resistor R11 for impedance matching that is connected at one end to the power supply voltage and connected at the other end to a negative phase input terminal to which the analog input signal VINN is input, and a buffer circuit 15 that inputs differential analog input signals VINP and VINN.

The T/H circuit 2 is configured of a T/H circuit 20 that holds the analog input signals VINP and VINN, which have been output from the input distribution circuit 1, in synchronization with the clock signals CK1P and CK1N output from the clock distribution circuit 3, and a T/H circuit 21 that holds the analog input signals VINP and VINN, which have been output from the input distribution circuit 1, in synchronization with the clock signals CK2P and CK2N output from the clock distribution circuit 3.

The clock distribution circuit 3 is configured of a 50Ω receiving end resistor R30 for impedance matching that is connected at one end to the power supply voltage and connected at the other end to a positive phase input terminal to which the clock signal CKP is input, a 50Ω receiving end resistor R31 for impedance matching that is connected at one end to the power supply voltage and connected at the other end to the negative phase input terminal to which the clock signal CKN is input, a buffer circuit 30 that inputs the clock signals CKP and CKN, a buffer circuit 31 that inputs the output of the buffer circuit 30 and outputs the clock signals CK1P and CK1N, and a buffer circuit 32 that inputs the output of the buffer circuit 30 and outputs the clock signals CK2P and CK2N.

The positive phase output signal of the buffer circuit 30 is input to the positive phase input terminal of the buffer circuit 31 and the negative phase input terminal of the buffer circuit 32. Further, the negative phase output signal of the buffer circuit 30 is input to the negative phase input terminal of the buffer circuit 31 and the positive phase input terminal of the buffer circuit 32. Therefore, the phase difference between the clock signals CK1P and CK1N and the clock signals CK2P and CK2N is 180°.

In order to improve the input sensitivity with respect to the clock signals CKP and CKN, the clock distribution circuit 3 is preferably a limiting type circuit having an amplification function. That is, the buffer circuit 30 may be used as an amplification circuit, the buffer circuits 31 and 32 may be used as amplification circuits, or all of the buffer circuits 30 to 32 may be used as amplification circuits.

The output buffer 4 is configured of a buffer circuit 40 that inputs the differential analog output signals VOUTP1 and VOUTN1 output from the T/H circuit 20, a buffer circuit 41 that inputs the differential analog output signals VOUTP2 and VOUTN2 output from the T/H circuit 21, a 50Ω feeding end resistor R40 for impedance matching that is connected at one end to the power supply voltage and connected at the other end to the positive phase output terminal of the buffer circuit 40, a 50Ω feeding end resistor R41 for impedance matching that is connected at one end to the power supply voltage and connected at the other end to the negative phase output terminal of the buffer circuit 40, a 50Ω feeding end resistor R42 for impedance matching that is connected at one end to the power supply voltage and connected at the other end to the positive phase output terminal of the buffer circuit 41, and a 50Ω feeding end resistor R43 for impedance matching that is connected at one end to the power supply voltage and connected at the other end to the negative phase output terminal of the buffer circuit 41.

As described above, the clock distribution circuit 3 outputs the differential clock signals CK1P and CK1N and the differential clock signals CK2P and CK2N. The input distribution circuit 1, the T/H circuit 2, and the output buffer 4 are differential input/differential output type circuits. Thus, in FIG. 1, the entire circuit is described as having a differential configuration, but an analog demultiplexer circuit may be also configured of single-phase circuits.

Next, the operational and functional features of the analog demultiplexer circuit 100 of the present embodiment will be described. The input distribution circuit 1 linearly distributes the analog input signals VINP and VINN into two.

The clock distribution circuit 3 generates the clock signals CK1P and CK1N and the clock signals CK2P and CK2N from the clock signals CKP and CKN.

The T/H circuit 20 samples the analog input signals VINP and VINN output from the input distribution circuit 1 at, for example, the rising timing of the clock signal CK1P (the falling timing of the clock signal CK1N), and holds the sampled values only while the clock signal CK1P is at a high level. The T/H circuit 21 samples the analog input signals VINP and VINN output from the input distribution circuit 1 at, for example, the rising timing of the clock signal CK2P (the falling timing of the clock signal CK2N), and holds the sampled values only while the clock signal CK2P is at a high level.

In the present embodiment, the frequencies of the clock signals CKP, CKN, CK1P, CK1N, CK2P, and CK2N are set to fa.

The buffer circuit 40 outputs the analog output signals VOUTP1 and VOUTN1 received from the T/H circuit 20. The buffer circuit 41 outputs the analog output signals VOUTP2 and VOUTN2 received from the T/H circuit 21.

Thus, the analog input signals VINP and VINN are complementarily tracked-and-held by the two T/H circuits 20 and 21 and output via the linear buffer circuits 40 and 41.

Figure 2A:
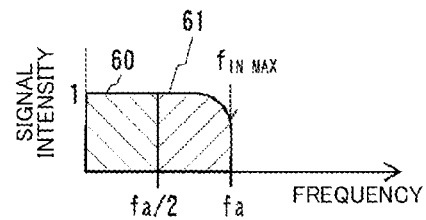
FIGS. 2A to 2D show signal bands of each part of the analog demultiplexer circuit according to the first embodiment of the present invention.
Figure 2B:
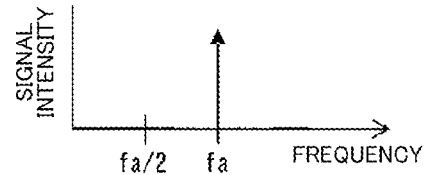
Figure 2C:
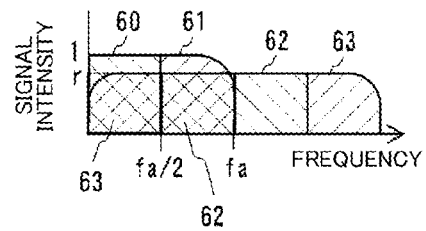
Figure 2D:
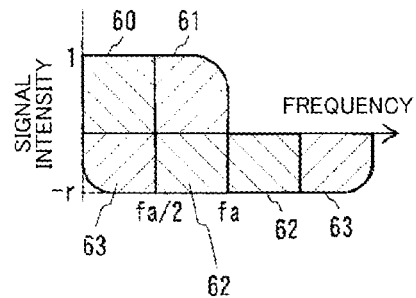

FIG. 2A shows the bands of the analog input signals VINP and VINN input to the analog demultiplexer circuit 100. FIG. 2B shows the bands of the clock signals CKP and CKN input to the analog demultiplexer circuit 100. FIG. 2C shows the bands of the analog output signals VOUTP1 and VOUTN1 output from the analog demultiplexer circuit 100. FIG. 2D shows the bands of the analog output signals VOUTP2 and VOUTN2 output from the analog demultiplexer circuit 100.

In the sampling theorem, when a certain signal is sampled at the frequency fa, a folding component of the signal is generated with the frequency fa as a boundary. That is, as shown in FIGS. 2A to 2D, when the analog input signals VINP and VINN to be sampled are broadband signals having components up to the frequency fa, the signal having a frequency of fa/2, which is the Nyquist frequency of the sampling frequency fa, or higher appears folding back in the frequency range of fa/2 or lower. This phenomenon is called aliasing. Aliasing is not desirable in sampling circuits for conventional applications, and it is common to prevent aliasing from occurring with an anti-aliasing filter or the like.

Meanwhile, the analog demultiplexer circuit 100 of the present embodiment is characterized in that aliasing is complementarily generated by two T/H circuits 20 and 21. When the analog demultiplexer circuit 100 of the present embodiment is used, the analog input signals VINP and VINN are sampled in synchronization with the clock signals CK1P and CK1N, and at the same time, in synchronization with the clock signals CK2P and CK2N complementary to the clock signals CKP and CK1N. Therefore, assuming that the phase of the folding component output from the T/H circuit 20 is 0°, the phase of the folding component output from the T/H circuit 21 is 180°.

Therefore, the analog output signals VOUTP1 and VOUTN1 and the analog output signals VOUTP2 and VOUTN2 output from the analog demultiplexer circuit 100 appear to be the combinations of the components of the analog input signals VINP and VINN and the folding components generated by sampling. However, depending on the intensity conditions and the like of the clock signals CK1P, CK1N, CK2P, and CK2N, the intensity of the folding components may be attenuated with respect to the intensity of the analog input signals VINP and VINN.

In FIGS. 2A to 2D, reference numeral 60 indicates a low-frequency component of the analog input signals VINP and VINN, and reference numeral 61 indicates a high-frequency component of the analog input signals VINP and VINN. Reference numeral 62 denotes the folding component generated by sampling the low-frequency components of the analog input signals VINP and VINN, and reference numeral 63 indicates the folding component generated by sampling the high-frequency components of the analog input signals VINP and VINN. Further, the ratio of the intensity of the folding components to the intensity of the analog input signals VINP and VINN is expressed by r.

Here, focusing on the frequency domain of fa/2 or less of the analog output signals VOUTP1, VOUTN1, VOUTP2, and VOUTN2, all the information related to the analog input signals VINP and VINN is included therein. The greatest feature of the analog demultiplexer circuit 100 of the present embodiment is that all the information related to the analog input signals VINP and VINN is included in the frequency domain of fa/2 or less. By using this information, it is possible to realize the wideband ADC described hereinbelow.

However, where the maximum frequency of the components of the analog input signals VINP and VINN is fIN_MAX, the band of the analog signal path of the input distribution circuit 1 and the T/H circuit 2 and the band of the clock signal path of the clock distribution circuit 3 and the T/H circuit 2 need to be fIN_MAX or more. Further, the band of the output buffer 4 needs to be fIN_MAX/2 or more.

Figure 3:
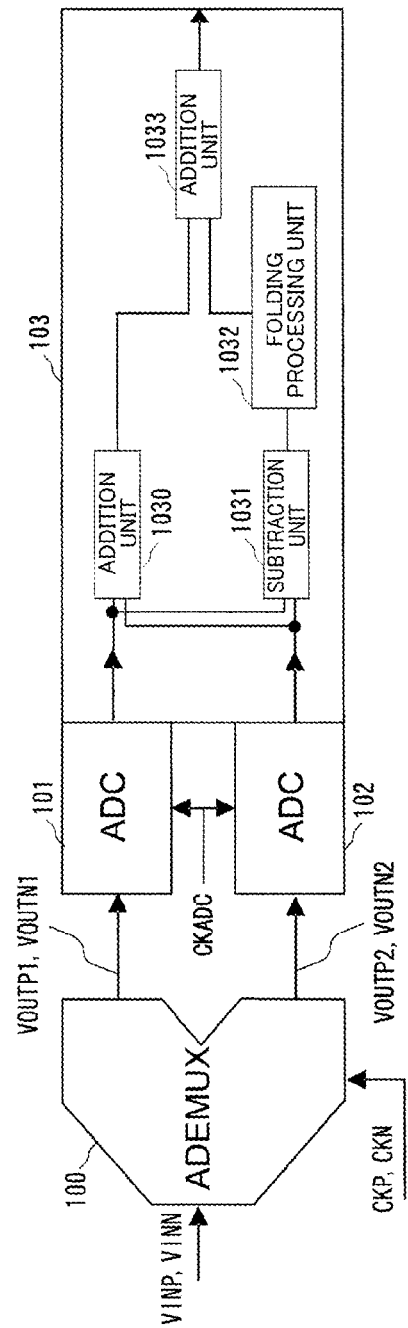
FIG. 3 is a block diagram showing a configuration of an analog-to-digital conversion system according to the first embodiment of the present invention.

FIG. 3 is a block diagram showing the configuration of the analog-to-digital conversion system of the present embodiment. The analog-to-digital conversion system includes the analog demultiplexer circuit 100, two ADCs 101 and 102 having an input band of fa/2, and a digital signal processing unit 103.

The digital signal processing unit 103 is configured of an addition unit 1030 that adds the output signal of the ADC 101 and the output signal of the ADC 102, a subtraction unit 1031 that subtracts the output number of the ADC 102 from the output signal of the ADC 101, a folding processing unit 1032 that executes frequency folding processing of the output signal of the subtraction unit 1031 with the frequency of fa/2 as a boundary, and an addition unit 1033 that adds the output signal of the addition unit 1030 and the output signal of the folding processing unit 1032.

Figure 4A:
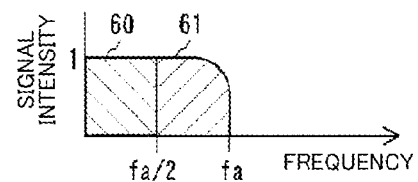
FIGS. 4A to 4J show a signal band of each part of the analog-to-digital conversion system according to the first embodiment of the present invention.
Figure 4B:
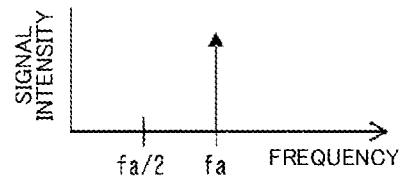
Figure 4C:
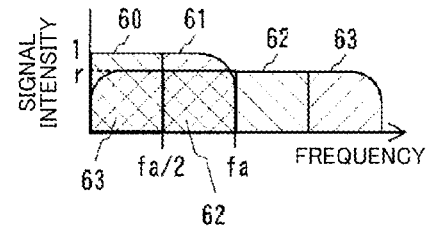
Figure 4D:
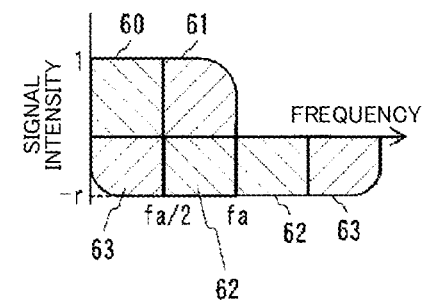
Figure 4E:
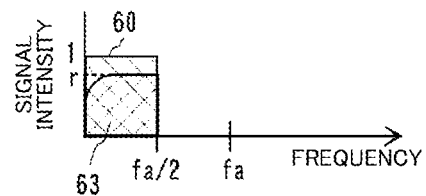
Figure 4F:
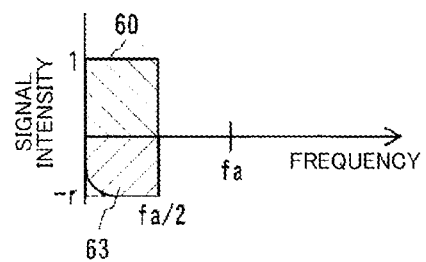
Figure 4G:
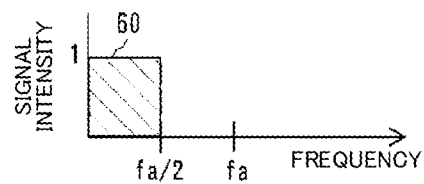
Figure 4H:
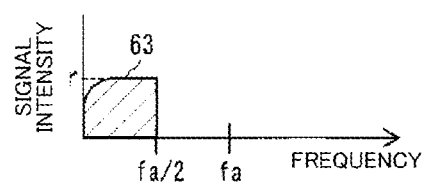
Figure 4I:
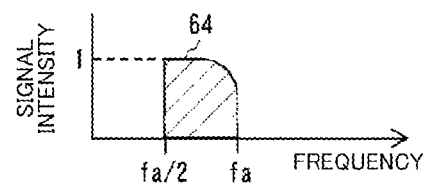
Figure 4J:
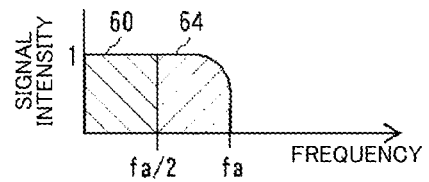

FIG. 4A shows the bands of the analog input signals VINP and VINN input to the analog demultiplexer circuit 100. FIG. 4B shows the bands of the clock signals CKP and CKN input to the analog demultiplexer circuit 100. FIG. 4C shows the bands of the analog output signals VOUTP1 and VOUTN1 output from the analog demultiplexer circuit 100. FIG. 4D shows the bands of the analog output signals VOUTP2 and VOUTN2 output from the analog demultiplexer circuit 100. FIG. 4E shows the band of the output signal of the ADC 101. FIG. 4F shows the band of the output signal of the ADC 102. FIG. 4G shows the band of the output signal of the addition unit 1030. FIG. 4H shows the band of the output signal of the subtraction unit 1031. FIG. 4I shows the band of the output signal of the folding processing unit 1032. FIG. 4J shows the band of the output signal of the addition unit 1033. Reference numeral 64 in FIGS. 4I and 4J shows a component obtained by intensity compensation by folding the output signal of the subtraction unit 1031 with the folding processing unit 1032.

As described above, the analog demultiplexer circuit 100 complementarily tracks-and-holds the analog input signals VINP and VINN with the maximum frequency component fIN_MAX in synchronization with the clock signals of frequency fa and outputs the tracked-and-held signals. However, at this time, it is assumed that fa≥fIN_MAX is satisfied. As a result, the analog demultiplexer circuit 100 outputs a combination of the components of the analog input signals VINP and VINN and the folding components generated by sampling. However, here, it is assumed that the component that is repeated at a frequency that is an integral multiple of the clock frequency fa will be ignored.

The ADC 101 with an input band limited to fa/2 converts the analog output signals VOUTP1 and VOUTN1 output from the analog demultiplexer circuit 100 into digital signals. Similarly, the ADC 102 with an input band limited to fa/2 converts the analog output signals VOUTP2 and VOUTN2 output from the analog demultiplexer circuit 100 into digital signals. By the processing of the ADCs 101 and 102, only the frequency components of fa/2 or less of each component of the analog output signals VOUTP1 and VOUTN1 and the analog output signals VOUTP2 and VOUTN2 are extracted as digital signals. It is assumed that a frequency of a clock signal CKADC of the ADCs 101 and 102, that is, a sampling frequency $f_{S\_ADC}$ of the ADCs 101 and 102 satisfies fa≤$f_{S\_ADC}$.

The addition unit 1030 of the digital signal processing unit 103 adds the digital signals output from the two ADCs 101 and 102.

The subtraction unit 1031 subtracts the digital signal output from the ADC 102 from the digital signal output from the ADC 101.

The folding processing unit 1032 executes the folding processing of the output signal of the subtraction unit 1031 with the frequency of fa/2 as a boundary. Further, the folding processing unit 1032 performs intensity compensation so that the signal intensity after the folding processing becomes the same as the intensity of the output signal of the addition unit 1030. The folding processing with the frequency of fa/2 as a boundary is equivalent to the processing of shifting the frequency of the output signal of the subtraction unit 1031 by fa to take a complex conjugate component.

The addition unit 1033 adds the output signal of the addition unit 1030 and the output signal of the folding processing unit 1032.

In this way, signals having the same band as the analog input signals VINP and VINN can be demodulated. As described above, with the analog-to-digital conversion system of the present embodiment, the analog input signals VINP and VINN having a signal component with a maximum frequency of fa can be converted into digital signals by using ADCs 101 and 102 with an input band limited to fa/2. That is, it is possible to achieve doubling of the input band and break through the band limit of the conventional ADC.

Further, the analog-to-digital conversion system of the present embodiment does not require a large-sized filter as in the analog-to-digital conversion system disclosed in NPL 2. Further, in the analog-to-digital conversion system of the present embodiment, since a large intensity difference/phase difference does not occur in the signals divided into two by the input distribution circuit 1 of the analog demultiplexer circuit 100, the compensation processing at the time of demodulation can be simplified as compared with the analog-to-digital conversion system disclosed in NPL 2.

The signal processing process of the analog-to-digital conversion system of the present embodiment is expressed by a mathematical formula as follows. Assuming that the analog signal input to the analog demultiplexer circuit 100 is $S_{IN}(f)$, the low-frequency component with fa/2 as a boundary is $S_L(f)$, and the high-frequency component with fa/2 as a boundary is $S_H(f)$, the analog signal $S_{IN}(f)$ is as follows.

$$S_{IN}(f)=S_L(f)+S_H(f) \quad (1)$$

Assuming that the analog output signals (above-mentioned VOUTP1 and VOUTN1) output from the buffer circuit 40 of the analog demultiplexer circuit 100 are $S_{OUT1}(f)$, and the analog output signal (above-mentioned VOUTP2 and VOUTN2) output from the buffer circuit 41 are $S_{OUT2}(f)$, the analog output signals $S_{OUT1}(f)$ and $S_{OUT2}(f)$ are as follows.

$$S_{OUT1}(f)=S_L(f)+S_H(f)+r\{S_L(f-fa)+S_H(f-fa)+S_L^*(-f-fa)+S_H^*(-f-fa)\} \quad (2)$$

$$S_{OUT2}(f)=S_L(f)+S_H(f)-r\{S_L(f-fa)+S_H(f-fa)+S_L^*(-f-fa)+S_H^*(-f-fa)\} \quad (3)$$

Here, S and S* are in a complex conjugate relationship. When the analog output signals $S_{OUT1}(f)$ and $S_{OUT2}(f)$ are AD-converted by the ADCs 101 and 102 with input bands limited to fa/2, only frequency components of fa/2 or less are extracted and converted into digital signals. The output signal $S_{ADC1}(f)$ of the ADC 101 and the output signal $S_{ADC2}(f)$ of the ADC 102 are as follows.

$$S_{ADC1}(f)=S_L(f)+rS_H^*(-f-fa) \quad (4)$$

$$S_{ADC2}(f)=S_L(f)-rS_H^*(-f-fa) \quad (5)$$

The output signal $S_{ADD}(f)$ of the addition unit 1030 and the output signal $S_{SUB}(f)$ of the subtraction unit 1031 are as follows.

$$S_{ADD}(f)=\tfrac{1}{2}\{S_{ADC1}(f)+S_{ADC2}(f)\}=S_L(f) \quad (6)$$

$$S_{SUB}(f)=\tfrac{1}{2}\{S_{ADC1}(f)-S_{ADC2}(f)\}=rS_H^*(-f-fa) \quad (7)$$

In equations (6) and (7), a coefficient of ½ is multiplied in order to keep the signal intensity at input and output constant, but this coefficient of ½ is not essential for the signal processing of the present invention.

Where the frequency folding processing with the frequency of fa/2 as a boundary is executed with respect to the output signal $S_{SUB}(f)$ of the subtraction unit 1031 and the intensity compensation (1/r times processing) is further executed, the output signal $S_{SUB}'(f)$ of the folding processing unit of 1032 is as follows.

$$S_{SUB}'(f)=S_H(f) \quad (8)$$

Finally, the signal $S_{OUT}(f)$ after the addition processing of the output signal $S_{ADD}(f)$ of the addition unit 1030 and the output signal $S_{SUB}'(f)$ of the folding processing unit 1032 becomes as follows.

$$S_{OUT}(f)=S_L(f)+S_H(f) \quad (9)$$

From the above, it can be seen that the signal $S_{OUT}(f)$ in the same band as the analog signal $S_{IN}(f)$ can be obtained.

Second Embodiment

Figure 5:
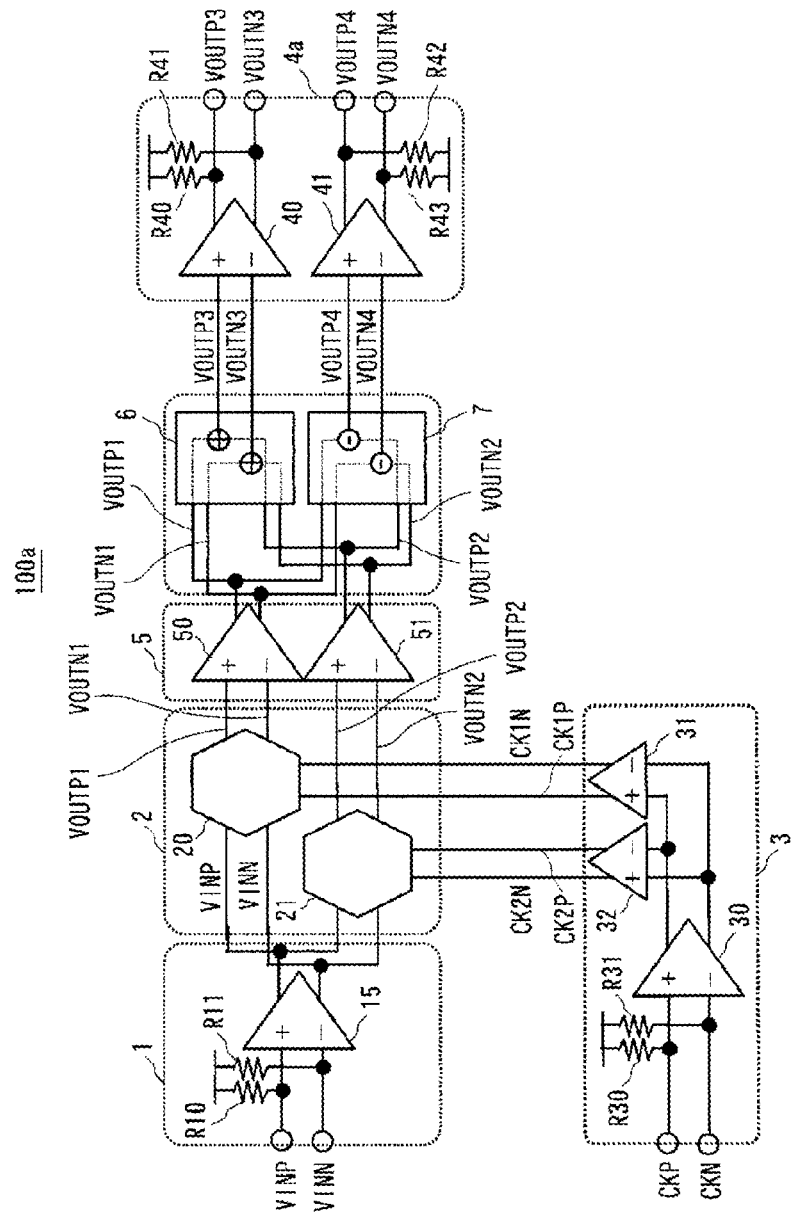
FIG. 5 is a block diagram showing a configuration of an analog demultiplexer circuit according to a second embodiment of the present invention.

Next, the second embodiment of the present invention will be described. FIG. 5 is a block diagram showing the configuration of the analog demultiplexer circuit according to the second embodiment of the present invention. In the configuration of the present embodiment, the processing in the digital signal processing unit is simplified.

An analog demultiplexer circuit 100a of the present embodiment includes the input distribution circuit 1, the T/H circuit 2, the clock distribution circuit 3, a distribution buffer 5 that distributes the differential analog output signals VOUTP1 and VOUTN1 and the differential analog output signals VOUTP2 and VOUTN2 output from the T/H circuit 2 into two, an addition circuit 6 that adds the differential analog output signals VOUTP1 and VOUTN1 and the differential analog output signals VOUTP2 and VOUTN2, a subtraction circuit 7 that subtracts the differential analog output signals VOUTP2 and VOUTN2 from the differential analog output signals VOUTP1 and VOUTN1, and an output buffer 4a that outputs differential analog output signals VOUTP3 and VOUTN3 received from the addition circuit 6 and differential analog output signals VOUTP4 and VOUTN4 received from the subtraction circuit 7.

The distribution buffer 5 is configured of a buffer circuit 50 that inputs the analog output signals VOUTP1 and VOUTN1 output from the T/H circuit 20, and a buffer circuit 51 that inputs the analog output signals VOUTP2 and VOUTN2 output from the T/H circuit 21.

The distribution buffer 5 is for strengthening the force for driving the addition circuit 6 and the subtraction circuit 7, and is not an essential component in the present invention.

The output buffer 4a is configured of a buffer circuit 40 that inputs the differential analog output signals VOUTP3 and VOUTN3 output from the addition circuit 6, a buffer circuit 41 that inputs the differential analog output signals VOUTP4 and VOUTN4 output from the subtraction circuit 7, the feeding end resistor R40 that is connected at one end to the power supply voltage and connected at the other end to the positive phase output terminal of the buffer circuit 40, the feeding end resistor R41 that is connected at one end to the power supply voltage and connected at the other end to the negative phase output terminal of the buffer circuit 40, the feeding end resistor R42 that is connected at one end to the power supply voltage and connected at the other end to the positive phase output terminal of the buffer circuit 41, and the feeding end resistor R43 that is connected at one end to the power supply voltage and connected at the other end to the negative phase output terminal of the buffer circuit 41.

Similar to the first embodiment, the input distribution circuit 1, the T/H circuit 2, the clock distribution circuit 3, the output buffer 4, the distribution buffer 5, the addition circuit 6, and the subtraction circuit 7 have differential input/differential output type circuits. In FIG. 5, the entire circuit is described as having a differential configuration, but the analog demultiplexer circuit may be configured of single-phase circuits.

Next, the operation and functions of the analog demultiplexer circuit 100a of the present embodiment will be described. The operations of the input distribution circuit 1, the T/H circuit 2, and the clock distribution circuit 3 are the same as those in the first embodiment.

The addition circuit 6 outputs the result of adding the positive-phase-side analog output signal VOUTP1, which is output from the buffer circuit 50 of the distribution buffer 5, and the positive-phase-side analog output signal VOUTP2, which is output from the buffer circuit 51, as the positive-phase-side analog output signal VOUTP3. Further, the addition circuit 6 outputs the result of adding the negative-phase-side analog output signal VOUTN1, which is output from the buffer circuit 50, and the negative-phase-side analog output signal VOUTN2, which is output from the buffer circuit 51, as the negative-phase-side analog output signal VOUTN3.

The subtraction circuit 7 outputs the result of subtracting the positive-phase-side analog output signal VOUTP2 from the positive-phase-side analog output signal VOUTP1 as the positive-phase-side analog output signal VOUTP4. Further, the subtraction circuit 7 outputs the result of subtracting the negative-phase-side analog output signal VOUTN2 from the negative-phase-side analog output signal VOUTN1 as the negative-phase-side analog output signal VOUTN4.

The buffer circuit 40 outputs the analog output signals VOUTP3 and VOUTN3 received from the addition circuit 6. The buffer circuit 41 outputs the analog output signals VOUTP4 and VOUTN4 received from the subtraction circuit 7.

Figure 6A:
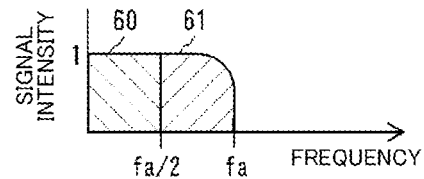
FIGS. 6A to 6F show signal bands of each part of the analog demultiplexer circuit according to the second embodiment of the present invention.
Figure 6B:
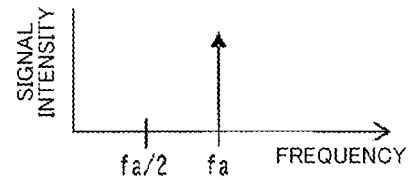
Figure 6C:
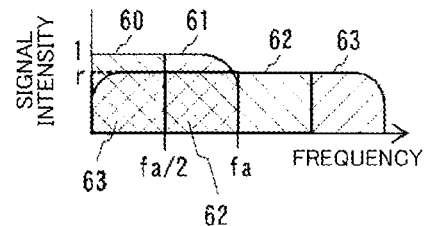
Figure 6D:
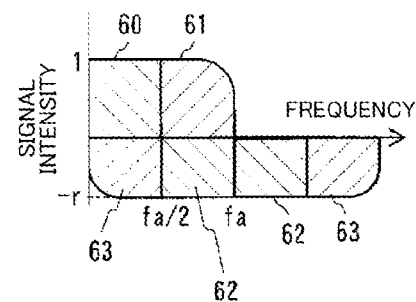
Figure 6E:
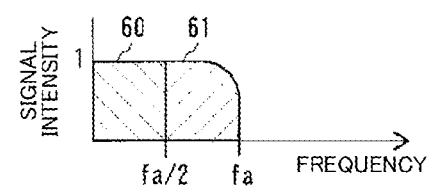
Figure 6F:
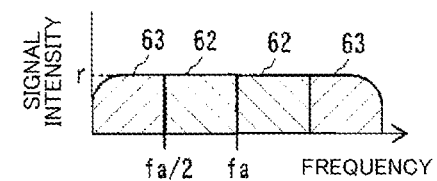

FIG. 6A shows the bands of the analog input signals VINP and VINN input to the analog demultiplexer circuit 100a. FIG. 6B shows the bands of the clock signals CKP and CKN input to the analog demultiplexer circuit 100a. FIG. 6C shows the bands of the analog output signals VOUTP1 and VOUTN1 output from the buffer circuit 50 of the distribution buffer 5. FIG. 6D shows the bands of the analog output signals VOUTP2 and VOUTN2 output from the buffer circuit 51 of the distribution buffer 5. FIG. 6E shows the bands of the analog output signals VOUTP3 and VOUTN3 output from the buffer circuit 40 of the output buffer 4a. FIG. 6F shows the bands of the analog output signals VOUTP4 and VOUTN4 output from the buffer circuit 41 of the output buffer 4a.

Only the components of the analog input signals VINP and VINN appear in the analog output signals VOUTP3 and VOUTN3 output from the analog demultiplexer circuit 100a. Meanwhile, only the folding components generated by sampling the analog input signals VINP and VINN appear in the analog output signals VOUTP4 and VOUTN4.

Here, only the low-frequency components of the analog input signals VINP and VINN are included in the frequency domain of fa/2 or less of the analog output signals VOUTP3 and VOUTN3, and only the high-frequency components of the analog input signals VINP and VINN are included in the frequency domain of fa/2 or less of the analog output signals VOUTP4 and VOUTN4. Because of this state, in the present embodiment, the PAPR (Peak to Average Power Ratio) of the output signals is reduced as compared with the first embodiment, and when the analog-to-digital conversion system described hereinbelow is configured, the dynamic range of the ADC can be effectively utilized, and improvement of SNR (signal-to-noise ratio) can be expected.

However, when the maximum frequency of the components of the analog input signals VINP and VINN is $f_{IN\_MAX}$, the band of the analog signal path of the input distribution circuit 1 and the T/H circuit 2 and the band of the clock signal path of the clock distribution circuit 3 and the T/H circuit 2 needs to be $f_{IN\_MAX}$ or more as in the first embodiment. Further, the bands of the distribution buffer 5, the addition circuit 6, the subtraction circuit 7, and the output buffer 4a need to be $f_{IN\_MAX}/2$ or more.

Figure 7:
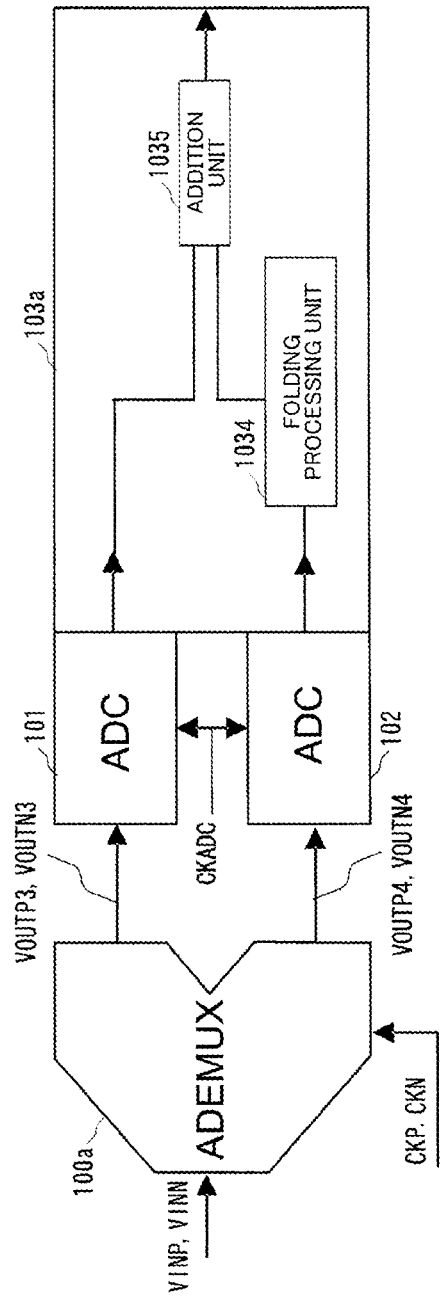
FIG. 7 is a block diagram showing a configuration of an analog-to-digital conversion system according to the second embodiment of the present invention.

FIG. 7 is a block diagram showing the configuration of the analog-to-digital conversion system of the present embodiment. The analog-to-digital conversion system of the present embodiment includes an analog demultiplexer circuit 100a, two ADCs 101 and 102 having an input band of fa/2, and a digital signal processing unit 103a.

The digital signal processing unit 103a is configured of a folding processing unit 1034 that executes the frequency folding processing with the frequency of fa/2 as a boundary with respect to the output signal of the ADC 102, and an addition unit 1035 that adds the output signal of the ADC 101 and the output signal of the folding processing unit 1034.

Figure 8A:
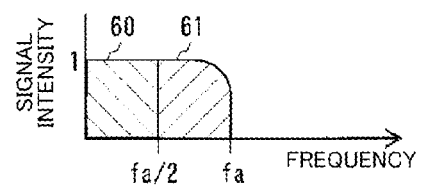
FIGS. 8A to 8H show signal bands of each part of the analog-to-digital conversion system according to the second embodiment of the present invention.
Figure 8B:
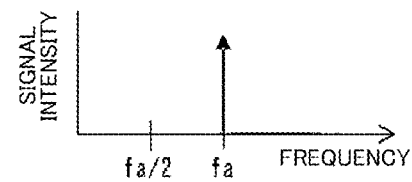
Figure 8C:
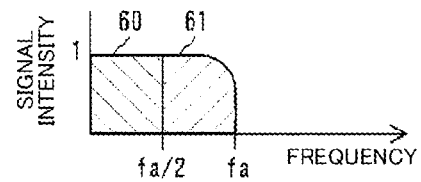
Figure 8D:
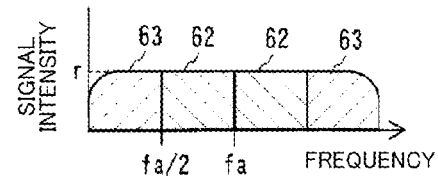
Figure 8E:
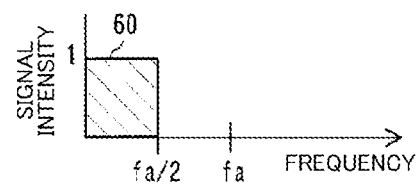
Figure 8F:
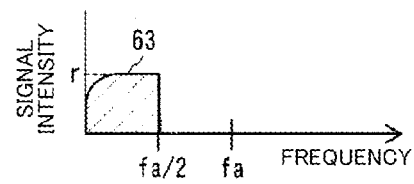
Figure 8G:
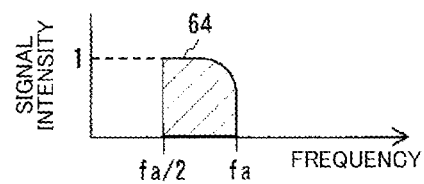
Figure 8H:
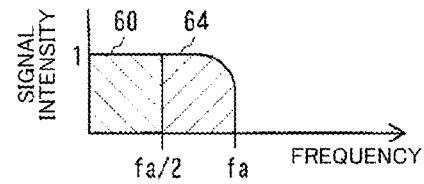

FIG. 8A shows the bands of the analog input signals VINP and VINN input to the analog demultiplexer circuit 100a. FIG. 8B shows the bands of the clock signals CKP and CKN input to the analog demultiplexer circuit 100a. FIG. 8C shows the bands of the analog output signals VOUTP3 and VOUTN3 output from the analog demultiplexer circuit 100a. FIG. 8D shows the bands of the analog output signals VOUTP4 and VOUTN4 output from the analog demultiplexer circuit 100a. FIG. 8E shows the band of the output signal of the ADC 101. FIG. 8F shows the band of the output signal of the ADC 102. FIG. 8G shows the band of the output signal of the folding processing unit 1034. FIG. 8H shows the band of the output signal of the addition unit 1035.

Similar to the first embodiment, the ADC 101 with the input band limited to fa/2 converts the analog output signals VOUTP3 and VOUTN3 output from the analog demultiplexer circuit 100a into digital signals. Similarly, the ADC 102 with the input band limited to fa/2 converts the analog output signals VOUTP4 and VOUTN4 output from the analog demultiplexer circuit 100a into digital signals.

The folding processing unit 1034 of the digital signal processing unit 103a executes the folding processing with the frequency of fa/2 as a boundary with respect to the output signal of the ADC 102. Further, the folding processing unit 1034 performs intensity compensation so that the signal intensity after the folding processing becomes the same as the intensity of the output signal of the ADC 101.

The addition unit 1035 adds the output signal of the ADC 101 and the output signal of the folding processing unit 1034.

In this way, signals having the same band as the analog input signals VINP and VINN can be demodulated. In the present embodiment, since the analog demultiplexer circuit 100a itself has an addition/subtraction function, the addition unit 1030 and the subtraction unit 1031 that were necessary in the first embodiment can be omitted in the digital signal processing unit 103a.

Figure 9:
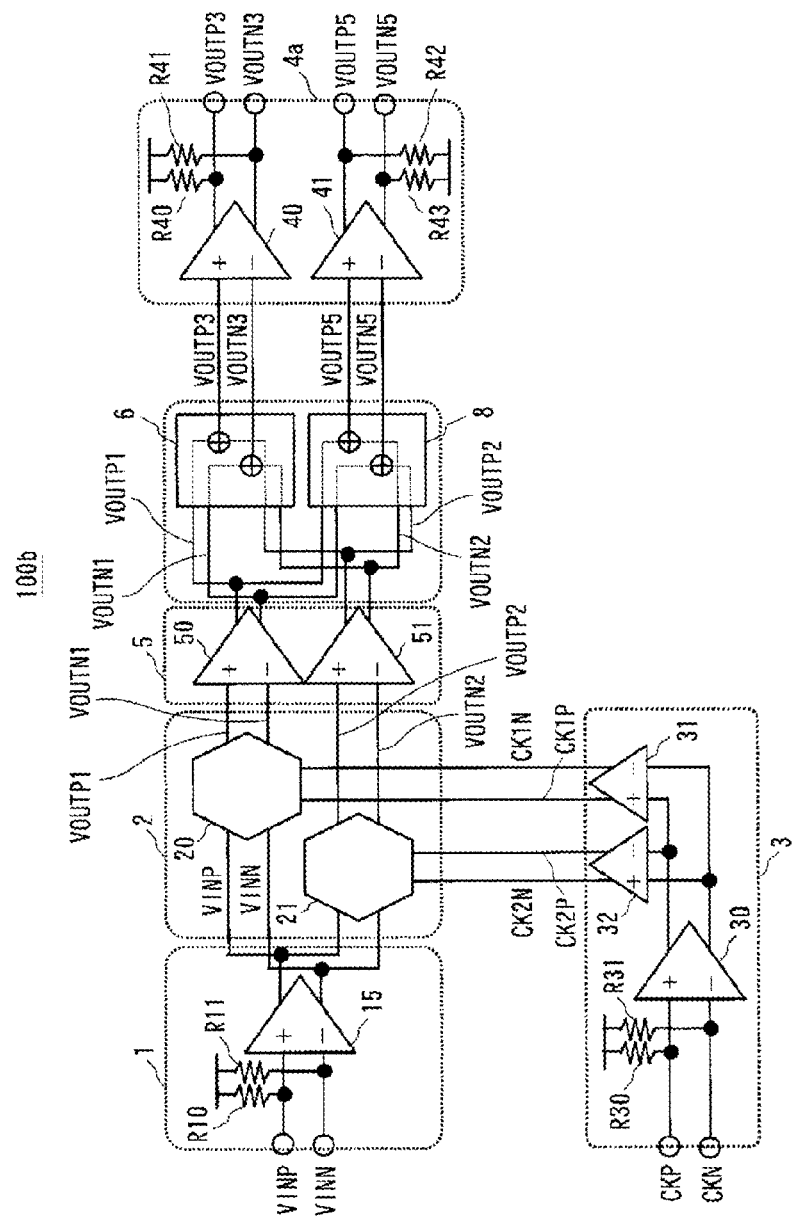
FIG. 9 is a block diagram showing another configuration of the analog demultiplexer circuit according to the second embodiment of the present invention.

FIG. 9 is a block diagram showing another configuration of the analog demultiplexer circuit of the present embodiment. An analog demultiplexer circuit 100b includes the input distribution circuit 1, the T/H circuit 2, the clock distribution circuit 3, the distribution buffer 5, the addition circuit 6, an addition circuit 8 that adds the differential analog output signals VOUTP1 and VOUTN1 and the differential analog output signals VOUTP2 and VOUTN2, and the output buffer 4a.

The addition circuit 8 outputs the result of adding the positive-phase-side analog output signal VOUTP1, which has been output from the buffer circuit 50 of the distribution buffer 5, and the negative-phase-side analog output signal VOUTN2, which has been output from the buffer circuit 51, as a positive-phase-side analog output signal VOUTP5. Further, the addition circuit 8 outputs the result of adding the negative-phase-side analog output signal VOUTN1, which has been output from the buffer circuit 50, and the positive-phase-side analog output signal VOUTP2, which has been output from the buffer circuit 51, as a negative-phase-side analog output signal VOUTN5.

The buffer circuit 40 outputs the analog output signals VOUTP3 and VOUTN3 received from the addition circuit 6. The buffer circuit 41 outputs the analog output signals VOUTP5 and VOUTN5 received from the addition circuit 8.

When the entire analog demultiplexer circuit has a differential configuration as in the present embodiment, it is possible to obtain the same result as with the analog demultiplexer circuit 100a of FIG. 5 only by the addition processing. The analog output signals VOUTP5 and VOUTN5 are signals having the same components as VOUTP4 and VOUTN4.

When the analog demultiplexer circuit 100b is used, the configuration of the analog-to-digital conversion system is also the same as that in FIG. 7.

Third Embodiment

Figure 10:
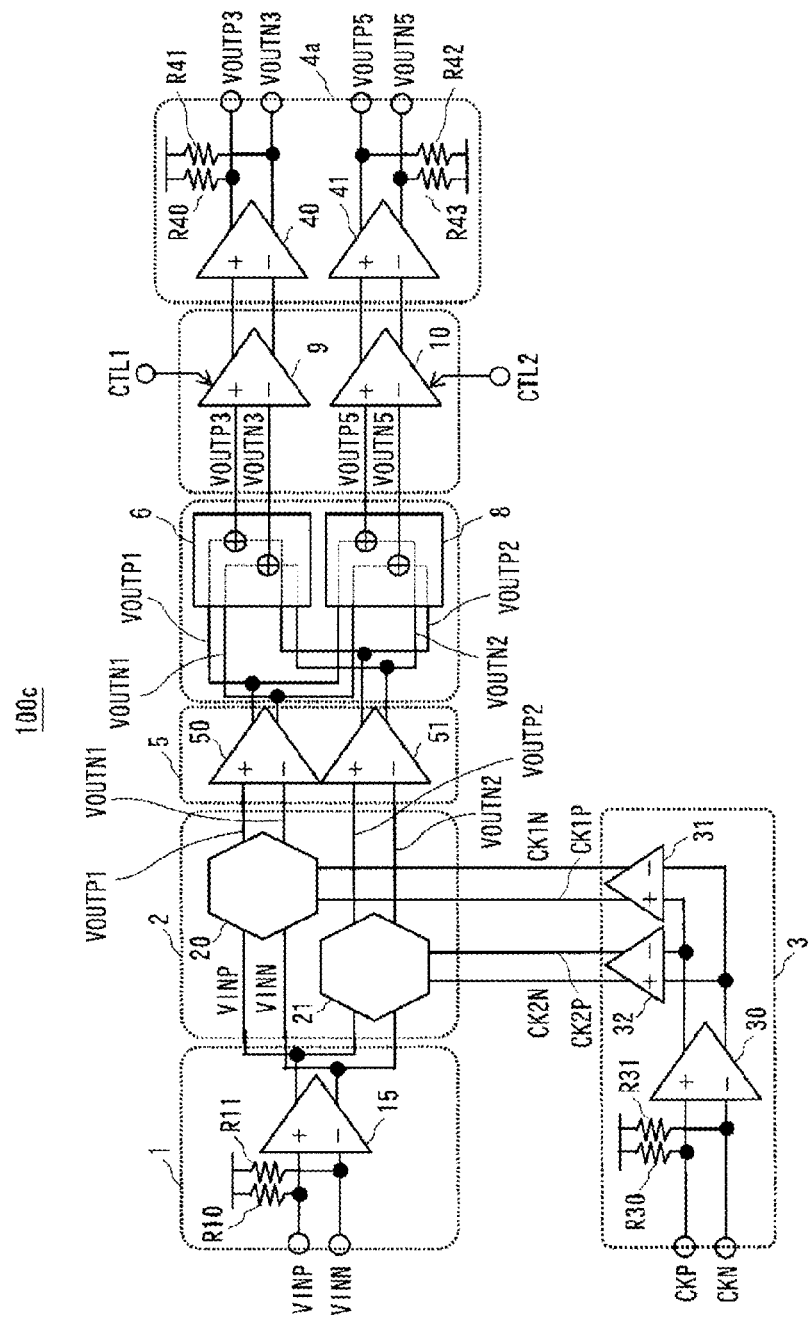
FIG. 10 is a block diagram showing a configuration of an analog demultiplexer circuit according to a third embodiment of the present invention.

Next, a third embodiment of the present invention will be described. FIG. 10 is a block diagram showing the configuration of the analog demultiplexer circuit according to the third embodiment of the present invention. In the present embodiment, the processing in the digital signal processing unit is simplified.

An analog demultiplexer circuit 100c of the present embodiment includes the input distribution circuit 1, the T/H circuit 2, the clock distribution circuit 3, the distribution buffer 5, the addition circuits 6 and 8, gain control amplifiers (GCAs) 9 and 10, and the output buffer 4a.

Next, the operation and functions of the analog demultiplexer circuit 100c of the present embodiment will be described. In the present embodiment, as compared with the second embodiment, the GCAs 9 and 10 are added between the addition circuits 6 and 8 and the output buffer 4a. The operation of the input distribution circuit 1, the T/H circuit 2, the clock distribution circuit 3, the distribution buffer 5, and the addition circuits 6 and 8 are the same as those in the second embodiment.

By controlling the gain of GCA 9 with a control signal CTL1, it is possible to adjust the amplitudes of the analog output signals VOUTP3 and VOUTN3 output from the addition circuit 6. Further, by controlling the gain of the GCA 10 by a control signal CTL2, it is possible to adjust the amplitudes of the analog output signals VOUTP5 and VOUTN5 output from the addition circuit 8.

GCAs 9 and 10 are differential input/differential output type circuits. In FIG. 10, the entire circuit is described as having a differential configuration, but the analog demultiplexer circuit may be configured of single-phase circuits.

The buffer circuit 40 outputs the analog output signals VOUTP3 and VOUTN3 from the GCA 9. The buffer circuit 41 outputs the analog output signals VOUTP5 and VOUTN5 from the GCA 10.

Figure 11A:
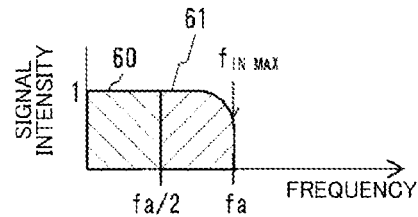
FIGS. 11A to 11H show signal bands of each part of the analog demultiplexer circuit according to the third embodiment of the present invention.
Figure 11B:
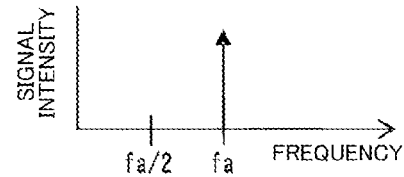
Figure 11C:
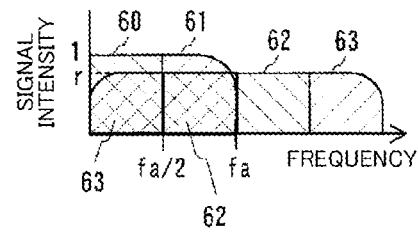
Figure 11D:
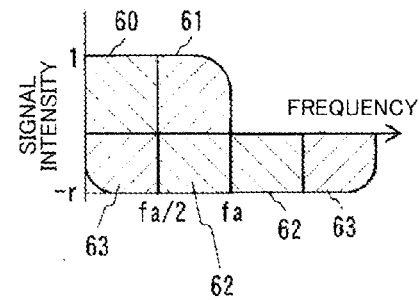
Figure 11E:
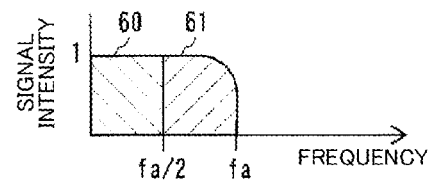
Figure 11F:
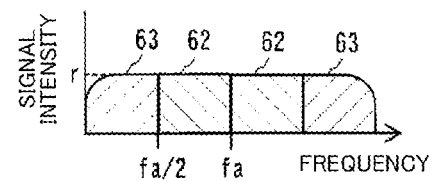
Figure 11G:
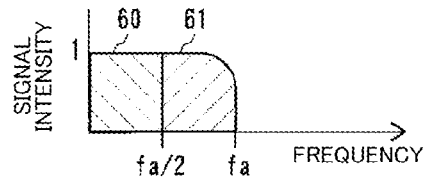
Figure 11H:
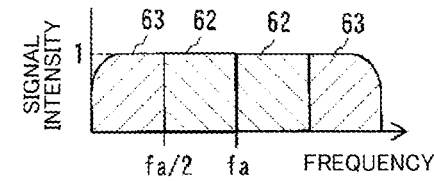

FIG. 11A shows the bands of the analog input signals VINP and VINN input to the analog demultiplexer circuit 100c. FIG. 1B shows the bands of clock signals CKP and CKN input to the analog demultiplexer circuit 100c. FIG. 11C shows the bands of the analog output signals VOUTP1 and VOUTN1 output from the buffer circuit 50 of the distribution buffer 5. FIG. 11D shows the bands of the analog output signals VOUTP2 and VOUTN2 output from the buffer circuit 51 of the distribution buffer 5. FIG. 11E shows the bands of the analog output signals VOUTP3 and VOUTN3 output from the addition circuit 6. FIG. 11F shows the bands of the analog output signals VOUTP5 and VOUTN5 output from the addition circuit 8. FIG. 11G shows the bands of the analog output signals VOUTP3 and VOUTN3 output from the buffer circuit 40 of the output buffer 4a. FIG. 1H shows the bands of the analog output signals VOUTP5 and VOUTN5 output from the buffer circuit 41 of the output buffer 4a.

Similar to the second embodiment, only the components of the analog input signals VINP and VINN appear in the analog output signals VOUTP3 and VOUTN3 output from the analog demultiplexer circuit 100c. Meanwhile, only the folding components generated by sampling the analog input signals VINP and VINN appear in the analog output signals VOUTP5 and VOUTN5.

In the present embodiment, the intensities (amplitudes) of the analog output signals VOUTP3 and VOUTN3 and the analog output signals VOUTP5 and VOUTN5 output from the analog demultiplexer circuit 100c can be made uniform, and when the analog-to-digital conversion system described hereinbelow is configured, further improvement of the SNR (signal-to-noise ratio) can be expected because the signal can be transferred with the signal amplitude optimum for the dynamic range of the ADC.

However, when the maximum frequency of the components of the analog input signals VINP and VINN is $f_{IN\_MAX}$, the band of the analog signal path of the input distribution circuit 1 and the T/H circuit 2 and the band of the clock signal path of the clock distribution circuit 3 and the T/H circuit 2 need to be $f_{IN\_MAX}$ or more, as in the first and second embodiments. Further, the bands of the distribution buffer 5, the addition circuits 6 and 8 and the GCAs 9 and 10 and the output buffer 4a need to be $f_{IN\_MAX}/2$ or more.

Figure 12:
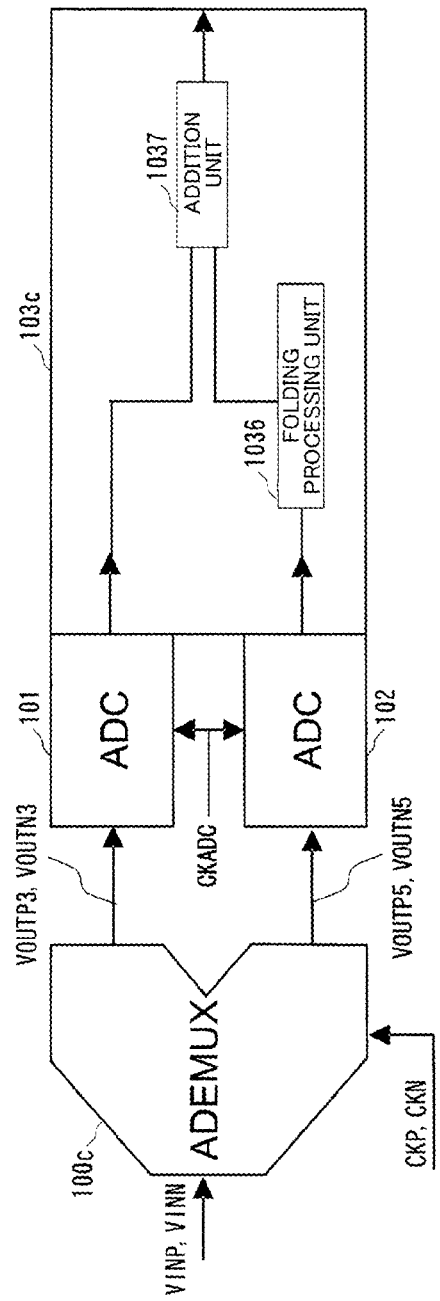
FIG. 12 is a block diagram showing a configuration of an analog-to-digital conversion system according to the third embodiment of the present invention.

FIG. 12 is a block diagram showing the configuration of the analog-to-digital conversion system of the present embodiment. The analog-to-digital conversion system of the present embodiment includes the analog demultiplexer circuit 100c, two ADCs 101 and 102 having an input band of fa/2, and a digital signal processing unit 103c.

The digital signal processing unit 103c is configured of a folding processing unit 1036 that executes the frequency folding processing with the frequency of fa/2 as a boundary with respect to the output signal of the ADC 102, and an addition unit 1037 that adds the output signal of the ADC 101 and the output signal of the folding processing unit 1036.

Figure 13A:
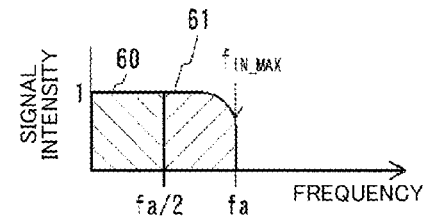
FIGS. 13A to 13G show signal bands of each part of the analog-to-digital conversion system according to the third embodiment of the present invention.
Figure 13B:
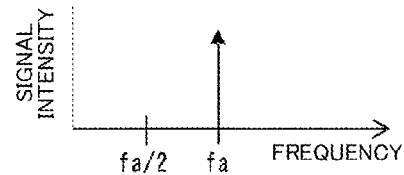
Figure 13C:
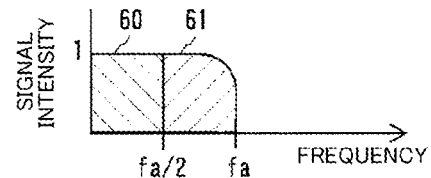
Figure 13D:
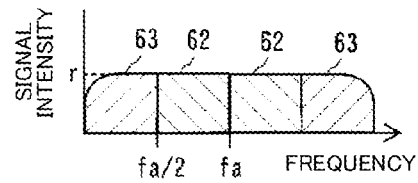
Figure 13E:
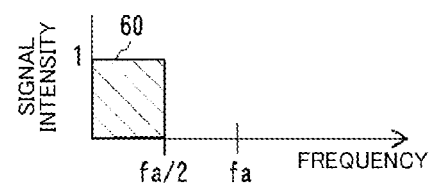
Figure 13F:
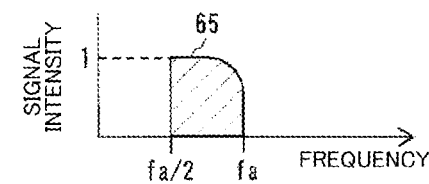

FIG. 13A shows the bands of the analog input signals VINP and VINN input to the analog demultiplexer circuit 100c. FIG. 13B shows the bands of the clock signals CKP and CKN input to the analog demultiplexer circuit 100c. FIG. 13C shows the bands of the analog output signals VOUTP3 and VOUTN3 output from the analog demultiplexer circuit 100c. FIG. 13D shows the bands of the analog output signals VOUTP5 and VOUTN5 output from the analog demultiplexer circuit 100c. FIG. 13E shows the band of the output signal of the ADC 101. FIG. 13F shows the band of the output signal of the folding processing unit 1036.

Figure 13G:
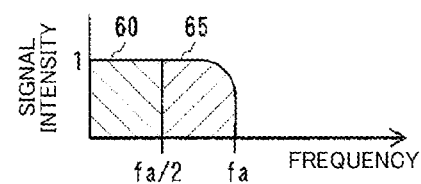

FIG. 13G shows the band of the output signal of the addition unit 1037. Reference numeral 65 in FIGS. 13F and 13G shows a component obtained by folding the output signal of the ADC 102 with the folding processing unit 1036.

Similarly to the second embodiment, the ADC 101 with the input band limited to fa/2 converts the analog output signals VOUTP3 and VOUTN3 output from the analog demultiplexer circuit 100c into digital signals. Similarly, the ADC 102 with the input band limited to fa/2 converts the analog output signals VOUTP5 and VOUTN5 output from the analog demultiplexer circuit 100c into digital signals.

The folding processing unit 1036 of the digital signal processing unit 103c executes the folding processing with the frequency of fa/2 as a boundary with respect to the output signal of the ADC 102.

The addition unit 1037 adds the output signal of the ADC 101 and the output signal of the folding processing unit 1036.

In this way, signals having the same band as the analog input signals VINP and VINN can be demodulated. In the present embodiment, since the analog demultiplexer circuit 100c itself has an intensity compensation function, the intensity compensation processing required in the first and second embodiments can be omitted in the digital signal processing unit 103c.

Figure 14:
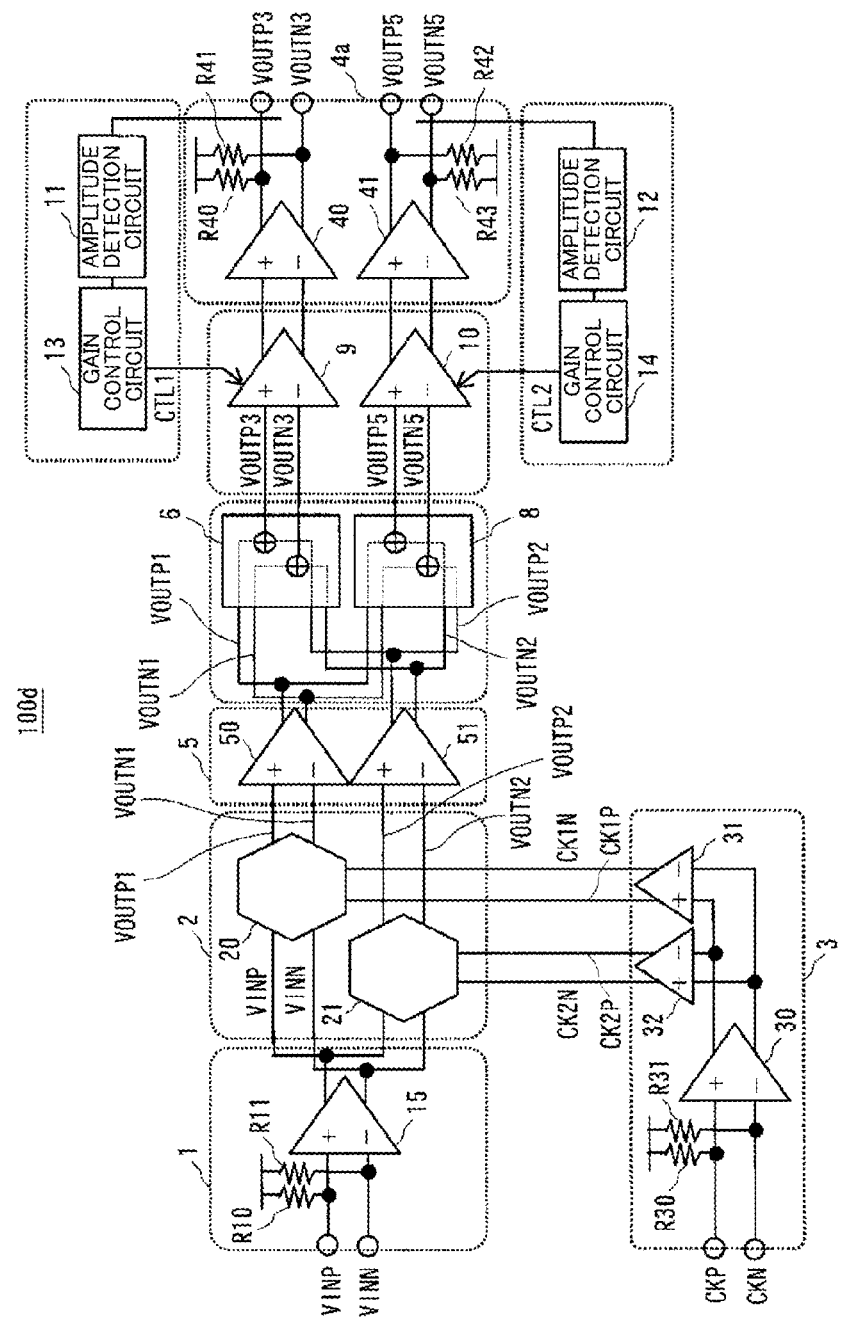
FIG. 14 is a block diagram showing another configuration of the analog demultiplexer circuit according to the third embodiment of the present invention.

FIG. 14 is a block diagram showing another configuration of the analog demultiplexer circuit of the present embodiment. An analog demultiplexer circuit 100d includes the input distribution circuit 1, the T/H circuit 2, the clock distribution circuit 3, the distribution buffer 5, the addition circuits 6 and 8, the GCAs 9 and 10, the output buffer 4a, amplitude detection circuits 11 and 12, and gain control circuits 13 and 14.

The amplitude detection circuit 11 detects the amplitudes of the analog output signals VOUTP3 and VOUTN3 output from the buffer circuit 40 of the output buffer 4a. The amplitude detection circuit 12 detects the amplitudes of the analog output signals VOUTP5 and VOUTN5 output from the buffer circuit 41 of the output buffer 4a.

The gain control circuit 13 controls the gain of the GCA 9 by generating the control signal CTL1 so that the amplitude detected by the amplitude detection circuit 11 becomes equal to an amplitude set value. The gain control circuit 14 controls the gain of the GCA 10 by generating the control signal CTL2 so that the amplitude detected by the amplitude detection circuit 12 becomes equal to an amplitude set value. The amplitude set values preset in the gain control circuit 13 and the gain control circuit 14 are the same values. In this way, the gains of the GCAs 9 and 10 can be automatically controlled.

In FIGS. 10 and 14, the addition circuit 8 is used, but the subtraction circuit 7 may be used instead of the addition circuit 8 as described in the second embodiment. When the analog-to-digital conversion system is composed of single-phase circuits, a single-phase input/single-phase output type subtraction circuit is used.

Further, in the first to third embodiments, the ADCs 101 and 102 have a differential input type configuration corresponding to the differential input/differential output type analog demultiplexer circuits 100 and 100a to 100d. Needless to say, if the analog demultiplexer circuit is of a single-phase output type, the single-phase input type ADCs 101 and 102 may be used.

Figure 15:
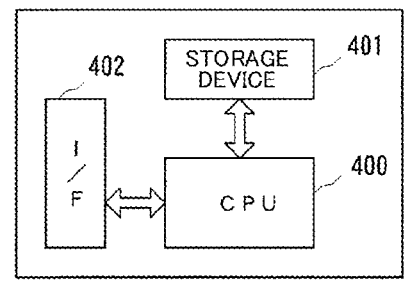
FIG. 15 is a block diagram showing a configuration example of a computer that realizes a digital signal processing unit according to the first to third embodiments of the present invention.
Figure 16:
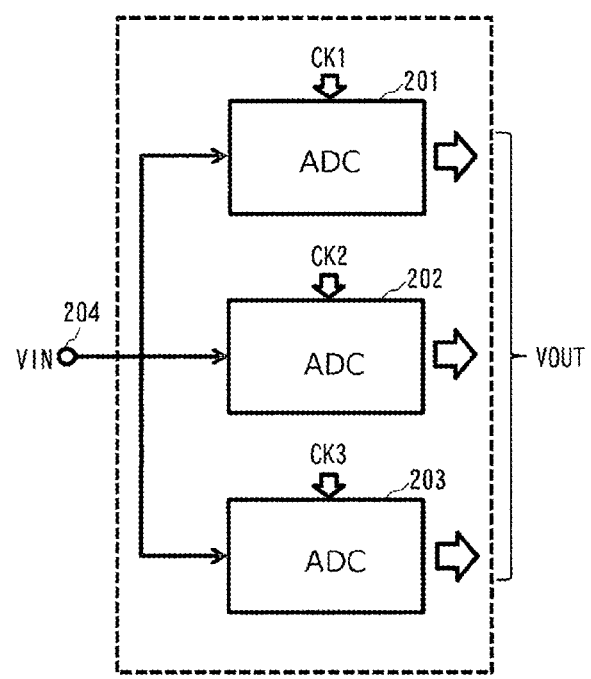
FIG. 16 is a block diagram showing a configuration of a time-interleaved ADC.
Figure 17:
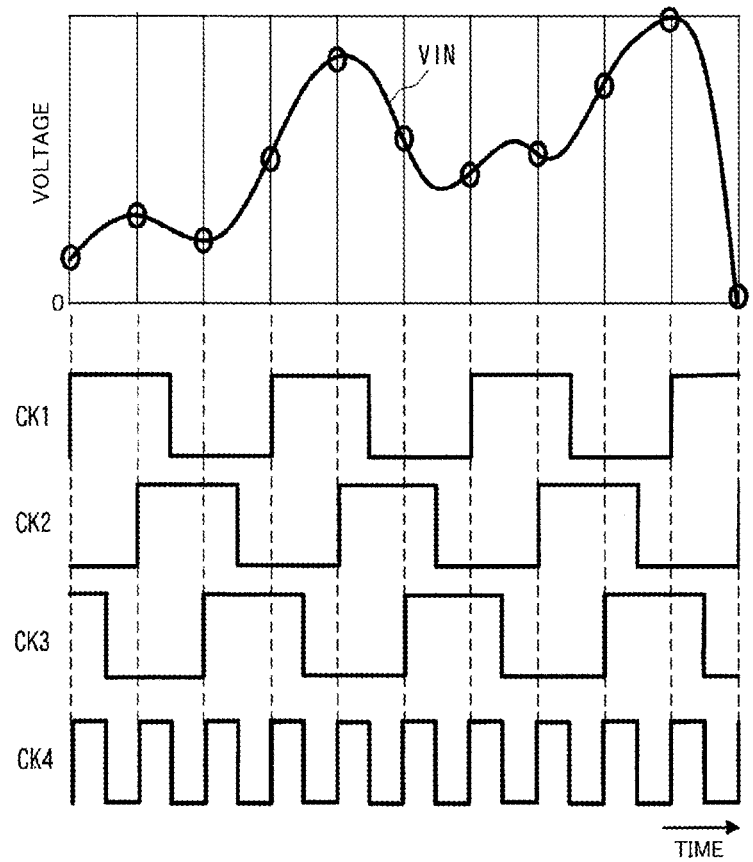
FIG. 17 is a waveform diagram illustrating the operation of the time-interleaved ADC.
Figure 18:
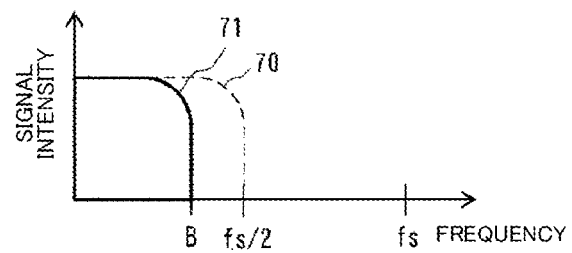
FIG. 18 is a diagram illustrating a problem of a time-interleaved ADC.
Figure 19:
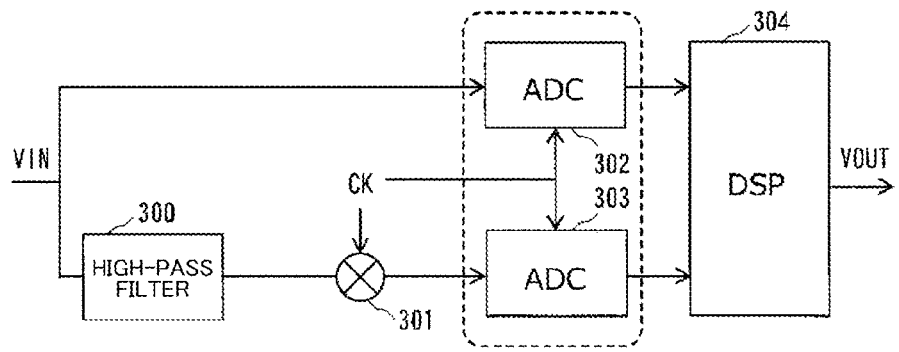
FIG. 19 is a block diagram showing a configuration of an analog-to-digital conversion system.
Figure 20A:
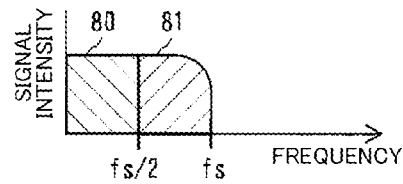
FIGS. 20A to 20F show signal bands of each part of the analog-to-digital conversion system.
Figure 20B:
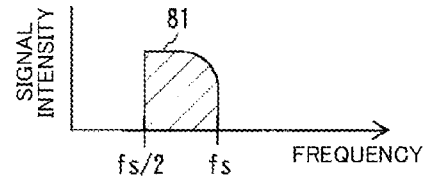
Figure 20C:
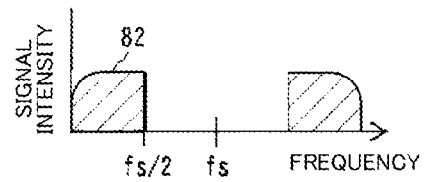
Figure 20D:
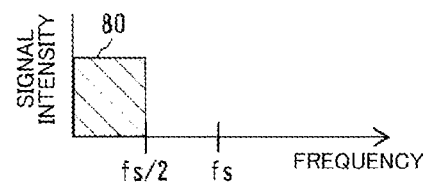
Figure 20E:
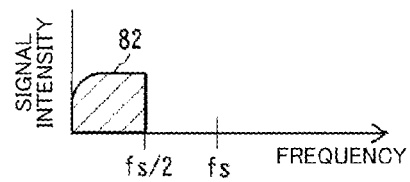
Figure 20F:
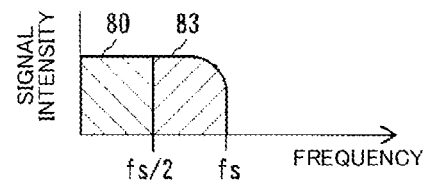

The digital signal processing units 103, 103a, and 103c described in the first to third embodiments can be realized by a computer including a CPU (Central Processing Unit), a storage device, and an interface, and a program for controlling these hardware resources. A configuration example of the computer is shown in FIG. 15.

The computer includes a CPU 400, a storage device 401, and an interface device 402. ADCs 101, 102 and the like are connected to the interface device 402. In such a computer, a program for realizing the digital signal processing units 103, 103a, and 103c of embodiments of the present invention is stored in the storage device 401. The CPU 400 executes the processes described in the first to third embodiments according to the program stored in the storage device 401.

INDUSTRIAL APPLICABILITY

Embodiments of the present invention can be applied to an analog-to-digital conversion system used in a high-speed signal transmission system or the like.

REFERENCE SIGNS LIST

1 Input distribution circuit
2, 20, 21 Track-and-hold circuit
3 Clock distribution circuit
4, 4a Output buffer
5 Distribution buffer
6,8 Addition circuit
7 Subtraction circuit
9, 10 Gain control amplifier
11, 12 Amplitude detection circuit
13, 14 Gain control circuit
15, 30 to 32, 40, 41, 50, 51 Buffer circuit
R10, R11, R30, R31 Receiving end resistor
R40 to R43 Feeding end resistor
100, 100a to 100d Analog demultiplexer circuit
101, 102 Analog-to-digital converter
103, 103a, 103c Digital signal processing unit
1030, 1033, 1035, 1037 Addition unit
1031 Subtraction unit
1032, 1034, 1036 Folding processing unit.

The invention claimed is:

1. An analog demultiplexer circuit comprising:
a clock distribution circuit configured to output first clock signals and second clock signals complementary thereto;
a first track-and-hold circuit configured to hold analog input signals in synchronization with the first clock signals; and
a second track-and-hold circuit configured to hold the analog input signals in synchronization with the second clock signals.

2. The analog demultiplexer circuit according to claim 1, further comprising:
a first addition circuit configured to add first output signals of the first track-and-hold circuit and second output signals of the second track-and-hold circuit; and
a subtraction circuit configured to subtract the second output signals of the second track-and-hold circuits from the first output signals of the first track-and-hold circuit.

3. The analog demultiplexer circuit according to claim 2, wherein the analog demultiplexer circuit is comprised in an analog-to-digital conversion system, the analog-to-digital conversion system comprising:
a first analog-to-digital converter configured to convert a first analog output signal output from the first addition circuit of the analog demultiplexer circuit into a first digital signal;

a second analog-to-digital converter configured to convert a second analog output signal output from the subtraction circuit of the analog demultiplexer circuit into a second digital signal;
a folding processor configured to execute a folding processing of a third output signal of the second analog-to-digital converter with a frequency of ½ of the first clock signals as a boundary; and
a second addition circuit configured to add a fourth output signal of the first analog-to-digital converter and a fifth output signal of the folding processor.

4. The analog-to-digital conversion system according to claim 3, wherein
the folding processor is configured to performs intensity compensation so that an intensity of a signal after the folding processing is the same as an intensity of the fourth output signal of the first analog-to-digital converter.

5. The analog demultiplexer circuit according to claim 1, further comprising:
a differential input/differential output type first addition circuit configured to add first output signals of the first track-and-hold circuit and second output signals of the second track-and-hold circuit; and
a differential input/differential output type second addition circuit configured to add the first output signals of the first track-and-hold circuit and the second output signals of the second track-and-hold circuit, wherein
the clock distribution circuit outputs the first clock signals and the second clock signals in the form of respective differential signals;
the first track-and-hold circuit and the second track-and-hold circuit are differential input/differential output type circuits;
the differential input/differential output type first addition circuit is configured to add a first positive-phase-side output signal of the first track-and-hold circuit and a second positive-phase-side output signal of the second track-and-hold circuit, and adds a first negative-phase-side output signal of the first track-and-hold circuit and a second negative-phase-side output signal of the second track-and-hold circuit; and
the differential input/differential output type second addition circuit is configured to add the first positive-phase-side output signal of the first track-and-hold circuit and the second negative-phase-side output signal of the second track-and-hold circuit, and adds the first negative-phase-side output signal of the first track-and-hold circuit and the second positive-phase-side output signal of the second track-and-hold circuit.

6. The analog demultiplexer circuit according to claim 5, wherein the analog demultiplexer circuit is comprised in an analog-to-digital conversion system, the analog-to-digital conversion system comprising:
a first differential input type analog-to-digital converter configured to convert a first analog output signal output from the differential input/differential output type first addition circuit of the analog demultiplexer circuit into a first digital signal;
a second differential input type analog-to-digital converter configured to convert a second analog output signal output from the differential input/differential output type second addition circuit of the analog demultiplexer circuit into a second digital signal;
a folding processor configured to execute a folding processing of a third output signal of the second differential input type analog-to-digital converter with a frequency of ½ of the first clock signals as a boundary; and
a third addition circuit configured to add a fourth output signal of the first differential input type analog-to-digital converter and a fifth output signal of the folding processor.

7. The analog-to-digital conversion system according to claim 6, wherein
the folding processor is configured to performs intensity compensation so that an intensity of a signal after the folding processing is the same as an intensity of the fourth output signal of the first differential input type analog-to-digital converter.

8. An analog-to-digital conversion system comprising:
a analog demultiplexer circuit, comprising:
a clock distribution circuit configured to output first clock signals and second clock signals complementary thereto;
a first track-and-hold circuit configured to hold analog input signals in synchronization with the first clock signals; and
a second track-and-hold circuit configured to hold the analog input signals in synchronization with the second clock signals;
a first analog-to-digital converter configured to convert a first analog output signal output from the first track-and-hold circuit of the analog demultiplexer circuit into a first digital signal;
a second analog-to-digital converter configured to convert a second analog output signal output from the second track-and-hold circuit of the analog demultiplexer circuit into a second digital signal;
a first addition circuit configured to add a first output signal of the first analog-to-digital converter and a second output signal of the second analog-to-digital converter;
a subtraction circuit configured to subtract the second output signal of the second analog-to-digital converter from the first output signal of the first analog-to-digital converter;
a folding processor configured to execute a folding processing of a third output signal of the subtraction circuit with a frequency of ½ of the first clock signals as a boundary; and
a second addition circuit configured to add a fourth output signal of the first addition circuit and a sixth output signal of the folding processor.

9. The analog-to-digital conversion system according to claim 8, wherein
the folding processor is configured to performs intensity compensation so that an intensity of a signal after the folding processing is the same as an intensity of the fourth output signal of the first addition circuit.

* * * * *